(12) United States Patent
Krogstrup Jeppesen

(10) Patent No.: US 11,711,986 B2
(45) Date of Patent: Jul. 25, 2023

(54) SUPERCONDUCTOR-SEMICONDUCTOR FABRICATION

(71) Applicant: Microsoft Technology Licensing, LLC, Redmond, WA (US)

(72) Inventor: Peter Krogstrup Jeppesen, Frederiksberg (DK)

(73) Assignee: Microsoft Technology Licensing LLC, Redmond, WA (US)

( * ) Notice: Subject to any disclaimer, the term of this patent is extended or adjusted under 35 U.S.C. 154(b) by 10 days.

(21) Appl. No.: 16/627,703

(22) PCT Filed: Nov. 30, 2017

(86) PCT No.: PCT/EP2017/081038
§ 371 (c)(1),
(2) Date: Dec. 30, 2019

(87) PCT Pub. No.: WO2019/001753
PCT Pub. Date: Jan. 3, 2019

(65) Prior Publication Data
US 2020/0176663 A1   Jun. 4, 2020

Related U.S. Application Data

(60) Provisional application No. 62/527,875, filed on Jun. 30, 2017.

(30) Foreign Application Priority Data
Nov. 15, 2017   (GB) ...................................... 1718897

(51) Int. Cl.
*H01L 27/18*   (2006.01)
*C23C 14/28*   (2006.01)
(Continued)

(52) U.S. Cl.
CPC .............. *H01L 27/18* (2013.01); *C23C 14/28* (2013.01); *C30B 11/12* (2013.01); *C30B 23/06* (2013.01);
(Continued)

(58) Field of Classification Search
CPC ..... H01L 27/18; H01L 29/0669; H01L 39/06; H01L 39/22; H01L 39/24; H01L 39/248;
(Continued)

(56) References Cited

U.S. PATENT DOCUMENTS 4,454,522 A   6/1984   Lozanne
5,294,869 A   3/1994   Tang et al.
(Continued)

FOREIGN PATENT DOCUMENTS

JP   2010283206 A   12/2010
JP   2014045111 A   3/2014
(Continued)

OTHER PUBLICATIONS

Krogstrup et al. Epitaxy of semiconductor-superconductor nanowires. Jan. 12, 2015. Nature Materials. Vol. 14, pp. 400-406.*
(Continued)

*Primary Examiner* — Hoang-Quan Ho
(74) *Attorney, Agent, or Firm* — Klarquist Sparkman LLP

(57) ABSTRACT

A mixed semiconductor-superconductor platform is fabricated in phases. In a masking phase, a dielectric mask is formed on a substrate, such that the dielectric mask leaves one or more regions of the substrate exposed. In a selective area growth phase, a semiconductor material is selectively grown on the substrate in the one or more exposed regions. In a superconductor growth phase, a layer of superconducting material is formed, at least part of which is in direct contact with the selectively grown semiconductor material. The mixed semiconductor-superconductor platform com-
(Continued)

prises the selectively grown semiconductor material and the superconducting material in direct contact with the selectively grown semiconductor material.

12 Claims, 13 Drawing Sheets

(51) Int. Cl.

| | |
|---|---|
| C30B 11/12 | (2006.01) |
| H01L 29/06 | (2006.01) |
| H01L 39/22 | (2006.01) |
| H01L 39/24 | (2006.01) |
| H01L 39/06 | (2006.01) |
| C30B 23/06 | (2006.01) |
| G06N 10/00 | (2022.01) |
| B82Y 10/00 | (2011.01) |

(52) U.S. Cl.
CPC .......... *H01L 29/0669* (2013.01); *H01L 39/06* (2013.01); *H01L 39/22* (2013.01); *H01L 39/24* (2013.01); *H01L 39/248* (2013.01); *H01L 39/249* (2013.01); *B82Y 10/00* (2013.01); *G06N 10/00* (2019.01)

(58) Field of Classification Search
CPC . H01L 39/249; H01L 29/0673; H01L 39/228; C23C 14/28; C30B 11/12; C30B 23/06; B82Y 10/00; G06N 10/00; G06N 99/00
See application file for complete search history.

(56) References Cited

U.S. PATENT DOCUMENTS

| | | | |
|---|---|---|---|
| 5,294,870 | A | 3/1994 | Tang et al. |
| 5,652,179 | A | 7/1997 | Strifler et al. |
| 6,517,996 | B1 | 2/2003 | Chao et al. |
| 6,882,524 | B2 | 4/2005 | Ulla et al. |
| 7,002,292 | B2 | 2/2006 | Prakash |
| 7,299,580 | B2 | 11/2007 | Wang et al. |
| 7,342,776 | B1 | 3/2008 | Chan |
| 7,569,470 | B2 | 8/2009 | Fernandez-Ceballos et al. |
| 7,633,218 | B2 | 12/2009 | Cok |
| 8,153,890 | B2 | 4/2012 | Wenham et al. |
| 8,166,649 | B2 | 5/2012 | Moore |
| 9,447,513 | B2 | 9/2016 | Mardilovich et al. |
| 9,459,665 | B2 | 10/2016 | Chang et al. |
| 9,483,076 | B2 | 11/2016 | Liang et al. |
| 9,540,855 | B2 | 1/2017 | Kato |
| 9,729,683 | B2 | 8/2017 | Okuley |
| 9,799,796 | B2 | 10/2017 | Herner et al. |
| 9,873,937 | B2 | 1/2018 | Lee et al. |
| 10,629,798 | B1 | 4/2020 | Kallaher et al. |
| 2005/0052831 | A1 | 3/2005 | Chen |
| 2006/0237599 | A1 | 10/2006 | Temus et al. |
| 2009/0242875 | A1 | 10/2009 | Zhitenev |
| 2011/0020979 | A1 | 1/2011 | Forrest et al. |
| 2011/0151190 | A1 | 6/2011 | Chung et al. |
| 2012/0140396 | A1 | 6/2012 | Zeliff et al. |
| 2012/0194448 | A1 | 8/2012 | Rothkopf |
| 2012/0229970 | A1 | 9/2012 | Hsu |
| 2013/0299783 | A1 | 11/2013 | Lutchyn et al. |
| 2016/0276570 | A1* | 9/2016 | Chang .................. H01L 39/223 |
| 2017/0133576 | A1 | 5/2017 | Marcus et al. |
| 2017/0141287 | A1* | 5/2017 | Barkeshli .............. H01L 39/223 |
| 2018/0358538 | A1 | 12/2018 | Brink et al. |
| 2019/0131513 | A1 | 5/2019 | Krogstrup et al. |
| 2020/0027919 | A1 | 1/2020 | Van Hoogdalem et al. |
| 2022/0102425 | A1 | 3/2022 | Van Hoogdalem et al. |

FOREIGN PATENT DOCUMENTS

| | | |
|---|---|---|
| KR | 300631455 | 2/2012 |
| KR | 2012-0092431 | 8/2012 |
| KR | 300687331 | 4/2013 |
| KR | 3008018220001 | 6/2015 |
| WO | WO 2009/029302 | 3/2009 |
| WO | 2016207415 A1 | 12/2016 |

OTHER PUBLICATIONS

Kanungo et al. Selective area growth of III-V nanowires and their heterostructures on silicon in a nanotube template: towards monolithic integration of nano-devices. May 1, 2013. Nanotechnology. vol. 24, pp. 1-6.*
Vukajlovic-Plestina et al. Molecular beam epitaxy of InAs nanowires in SiO2 nanotube templates: challenges and prospects for integration of III-Vs on Si. Oct. 3, 2016. Nanotechnology. vol. 27, pp. 1-9.*
Notice of Allowance issued in U.S. Appl. No. 16/484,088, dated Aug. 5, 2021, 9 Pages.
Application as Filed in International Patent Application No. PCT/EP2019/083906, 32 pp.
Ariel-Sternberg, "PMMA Resist Processing Standard Operating Procedure," Columbia University, Columbia Nano Initiative, downloaded from https://static1.squarespace.com/static/57b26cc76b8f5b7524bf9ed2/t/59272752d2b857857ae994c6/1495738198009/PMMA_Process_SOP_May2017.pdf, 6 pp. (downloaded on Mar. 26, 2020).
Aseev et al., "Selectivity Map for Molecular Beam Epitaxy of Advanced III-V Quantum Nanowire Networks," *Nano Letters*, vol. 19, pp. 218-227 (Dec. 2018).
Communication pursuant to Rules 161(1) and 162 EPC dated Jun. 12, 2020, from European Patent Application No. 18800020.2, 3 pp.
Davies et al., "Selective Area Growth of III-V Semiconductors by Chemical Beam Epitaxy: Study of Reaction Mechanisms," *SPIE Proc. Epitaxial Growth Processes*, pp. 58-67 (May 1994).
Fahed, "Seletive Area Growth of In-Plane III-V Nanostructures using Molecular Beam Epitaxy," Ph.D. Thesis, Universite de Lille, 140 p. (Nov. 2016).
Fukui et al., "GaAs tetrahedral quantum dot structures fabricated using selective area metalorganic chemical vapor deposition," *Applied Physics Letters*, vol. 58, No. 18, 4 pp. (May 1991).
Hachman, "Surface Pro is Microsoft's Long-Awaited Surface Pro 4 Upgrade, Restyled as a Laptop," downloaded from World Wide Web, 5 pp. (May 2017).
International Preliminary Report on Patentability dated Jan. 9, 2020, from International Patent Application No. PCT/EP2017/081038, 7 pp.
International Search Report and Written Opinion dated Aug. 29, 2019, from International Patent Application No. PCT/US2018/057841, 20 pp.
Office Action dated May 21, 2020, from U.S. Appl. No. 16/484,088, 7 pp.
Pfeiffer Vacuum GmbH, "1.2.5 Mean free path," downloaded from https://www.pfeiffer-vacuum.com/en/know-how/introduction-to-vacuum-technology/fundamentals/mean-free-path/, 8 pp. (downloaded on Mar. 26, 2020).
Shin-Etsu MicroSi, Inc., "The Difference Between Positive and Negative Photoresist," downloaded from https://www.microsi.com/the-difference-between-positive-and-negative-photoresist/, 2 pp. (Mar. 2013).
Wikipedia, "Evaporation (deposition)," downloaded from https://en.wikipedia.org/wiki/Evaporation_(deposition), 4 pp. (document marked: "last edited on Feb. 15, 2020").
Communication pursuant to Rules 161(1) and 162 EPC dated Dec. 13, 2019, from European Patent Application No. 17808439.8, 3 pp.
Das Kanungo et al., "Selective area growth of III-V nanowires and their heterostructures on silicon in a nanotube template: towards monolithic integration of nano-devices," *Nanotechnology*, vol. 24, No. 22, pp. 1-6 (May 2013).
International Search Report and Written Opinion dated Mar. 27, 2018, from International Patent Application No. PCT/EP2017/081038, 13 pp.
Krogstrup et al., "Epitaxy of semiconductor-superconductor nanowires," *Nature Materials*, vol. 14, No. 4, pp. 400-406 (Apr. 2015).

(56) References Cited

OTHER PUBLICATIONS

Lutchyn et al., "Realizing Majorana zero modes in superconductor-semiconductor heterostructures," arXiv:1707.04899v1, pp. 1-18 (Jul. 2017).
Shabani et al., "Two-dimensional epitaxial superconductor-semiconductor heterostructures: A platform for topological superconducting networks," *Physical Review B*, vol. 93, No. 15, pp. 1-6 (Apr. 2016).
Non-Final Office Action issued in U.S. Appl. No. 16/484,088, dated Oct. 9, 2020, 8 pages.
"Office Action Issued in Japanese Patent Application No. 2019-571656", dated Dec. 7, 2021, 8 Pages.
"Office Action Issued in Korean Patent Application No. 10-2020-7002956", dated May 6, 2022, 13 Pages.
"Office Action Issued in Indian Patent Application No. 201947046467", dated Mar. 9, 2022, 6 Pages.
"Office Action Issued in European Patent Application No. 17808439.8", dated Sep. 29, 2021, 4 Pages.
KR 10-2020-7002956, 10-2020/0019247, filed Nov. 30, 2017, dated Feb. 21, 2020.
JP 2019-571656, P2020-526021A, filed Nov. 30, 2017, Aug. 27, 2020.
IN201847046467A, filed Nov. 30, 2017, dated Nov. 22, 2019.
EP 17808439.9, EP 3639302, filed Nov. 30, 2017, Apr. 22, 2020.
CN201780092102.2, CN110741486A, filed Nov. 30, 2017, dated Jan. 31, 2020.
"Office Action Issued in Japanese Patent Application No. 2019-571656", dated Jun. 28, 2022, 4 Pages.
Nov. 15, 2017, 1718897.0.
Jun. 30, 2017, 62/527875.
Nov. 30, 2017, 201780092102.2, dated Dec. 12, 2019, Jan. 31, 2020, CN110741486A.
Nov. 30, 2017, 17808439.8, dated Dec. 3, 2019, Apr. 22, 2020, 3639302.
Nov. 30, 2017, 2019470467, dated Nov. 14, 2019, Nov. 22, 2019, 201947046467A.
Nov. 30, 2017, 2019-571656, dated Dec. 25, 2019, Aug. 27, 2020, P2020-526021A.
Nov. 30, 2017, 10-2020-7002956, dated Jan. 30, 2020, Feb. 21, 2020, 10-2020-0019247.
Oct. 26, 2018, 2018367378, dated Apr. 27, 2020.
Oct. 26, 2018, 18800020.2, dated May 15, 2020, Aug. 19, 2020, 3695440.
Jul. 21, 2021, U.S. Appl. No. 17/382,174, dated Mar. 31, 2022, US-2022-0102425-A1.
Oct. 26, 2018, U.S. Appl. No. 16/484,088, dated Aug. 6, 2019, Jan. 23, 2020, US-2020-0027919-A1, Apr. 5, 2022.
Dec. 29, 2017, 201780097735.2, dated Jun. 15, 2020, dated Jul. 31, 2020, CN111479947A.
Dec. 29, 2017, 202047021124, dated May 19, 2020, dated Jun. 26, 2020, 20204702112A.
Dec. 29, 2017, U.S. Appl. No. 16/957,030, dated Jun. 22, 2020, dated Dec. 17, 2020, US-2020-0392644-A1.
Dec. 29, 2017, PCT/EP17/084833, dated Jun. 4, 2019, WO2019/129364.
Dec. 28, 2020, U.S. Appl. No. 17/135,632, dated Apr. 22, 2021, US-2021-0119125-A1, Aug. 23, 2022.
Jan. 11, 2019, U.S. Appl. No. 16/246,287, dated Jul. 16, 2020, US-2020-0227636-A1.
Jan. 17, 2020, 2020211895, dated May 28, 2021.
Jan. 17, 2020, 202080008378, dated Jul. 15, 2021, Aug. 24, 2021, CN113302760A.
Jan. 17, 2020, 20705855.3, dated Jul. 9, 2021, Dec. 1, 2021, 3915152.
Apr. 7, 2022, 22167178.7, dated Aug. 17, 2022, 4044266.
Jan. 117, 2020, 202147032428, dated Jul. 19, 2021, Jul. 23, 2021, 202147032428A.
Jan. 17, 2020, 10-2021-7022655, dated Jul. 16, 2021, Oct. 1, 2021, 10-2021-0118830.
May 27, 2021, U.S. Appl. No. 17/332,908, dated Sep. 23, 2021, US-2021-0296560-A1.
Jan. 25, 2019, U.S. Appl. No. 16/258,025, dated Jul. 30, 2020, US-2020-0243742-A1, dated Jun. 1, 2021, U.S. Appl. No. 11/024,792.
Jan. 17, 2020, PCT/US20/014202, dated Jul. 30, 2020, WO2020/154209.
Jul. 29, 2019, 2019459230, dated Dec. 2, 2021.
Jul. 29, 2019, 10-2021-7041226, Dec. 15, 2021, Mar. 28, 2022, 10-2022-0038286.
Aug. 11, 2020, 20761683.0, Feb. 7, 2022, May 11, 2022, 3994838.
Aug. 11, 2020, U.S. Appl. No. 17/634,233, Feb. 9, 2022, Sep. 1, 2022, US-2022-77216-A1.
Aug. 12, 2019, U.S. Appl. No. 62/885,715.
Aug. 11, 2020, PCT/US 20/045791, Feb. 18, 2021, WO2021/030363.
Sep. 16, 2019, 19769791.5, Mar. 14, 2022, Jul. 27, 2022, 4032119.
Sep. 16, 2019, U.S. Appl. No. 17/753,820, Mar. 15, 2022.
Sep. 16, 2019, PCT/EP19/074704, Mar. 25, 2021, WO2021/052559.
Dec. 5, 2019, 2019477015, Jun. 15, 2022.
Dec. 5, 2019, 201980102748.3, Jun. 2, 2022, Jul. 12, 2022, CN114747014A.
Dec. 5, 2019, 19817246.2, May 25, 2022.
Dec. 5, 2019, 202247030046, May 25, 2022.
Dec. 5, 2019, 2022-533642, Jun. 3, 2022.
Dec. 5, 2019, U.S. Appl. No. 17/756,815, Jun. 2, 2022.
Dec. 5, 2019, PCT/EP19/083904, Jun. 10, 2021, WO2021/110274.
Dec. 5, 2019, 19817248.8, May 26, 2022.
Dec. 5, 2019, U.S. Appl. No. 17/756,813, Jun. 2, 2022.
Dec. 5, 2019, PCT/EP19/083906, Jun. 10, 2021, WO2021/110275.
Dec. 4, 2019, 2020395314, Jun. 15, 2022.
Dec. 4, 2019, 202080084194.1, Jun. 2, 2022, Jul. 22, 2022, CN114788026A.
Dec. 4, 2019, 20830437.8, May 26, 2022.
Dec. 4, 2019, 202247030042, May 25, 2022.
Dec. 4, 2019, 2022-530890, May 26, 2022.
Dec. 4, 2019, 10-2022-7021272, Jun. 22, 2022, Aug. 4, 2022, 10-2022-0109419.
Dec. 23, 2021, U.S. Appl. No. 17/561,330, May 12, 2022, US-2022-0149262-A1.
Feb. 20, 2020, U.S. Appl. No. 16/796,671, Jun. 10, 2021, US-2021-0175408-A1, Dec. 28, 2021, U.S. Pat. No. 11,211,543.
Dec. 5, 2019, U.S. Appl. No. 62/944,093.
Dec. 4, 2019, PCT/US 20/063459, Jun. 10, 2021m WO2021/113746.
Sep. 11, 2020, 2014347.5.
Nov. 11, 2020, PCT/EP20/081723, Mar. 17, 2022, ,WO2022/053170.
Dec. 4, 2019, PCT/EP20/084618, Jun. 9, 2022, WO2022/117206.
Jan. 13, 2021, PCT/EP21/050587, Jul. 21, 2022, WO2022/152373.
Aug. 6, 2021, PCT/US21/045075.
Nov. 11, 2021, PCT/US21/059005.
Nov. 10, 2021, PCT/US21/058734.
"Office Action Issued in Australian Patent Application No. 2018367378", dated Sep. 13, 2022, 3 Pages.
Nov. 30, 2017, 1718897.0.
Nov. 15, 2017, U.S. Appl. No. 62/527,875.
Jun. 30, 2017, 201780092102.2, dated Dec. 12, 2019, dated Jan. 31, 2020, CN110741486A.
Nov. 30, 2017, 17808439.8, dated Dec. 3, 2019, dated Apr. 22, 2020, 3639302.
Nov. 30, 2017, 201947046467, Nov. 14, 2019, Nov. 22, 2019, 201947046467A.
Nov. 30, 2017, 2019-571656, Dec. 25, 2019, Aug. 27, 2020, P2020-526021A.
Nov. 30, 2017, 10-2020-7002956, dated Jan. 30, 2020, dated Feb. 21, 2020, 10-2020-0019247.
Nov. 30, 2017, PCT/EP17/081038, dated Jan. 3, 2019, WO2019/001753.
Nov. 30, 2017, 2018367378, dated Apr. 27, 2020.
Oct, 26, 2018, 18800020.2, dated May 15, 2020, dated Aug. 19, 2020, 3695440.
Oct. 26, 2018, U.S. Appl. No. 17/382,174, dated Mar. 31, 2022, US-2022-0102425-A1.

(56) References Cited

OTHER PUBLICATIONS

Jul. 21, 2021, U.S. Appl. No. 16/484,088, dated Aug. 6, 2019, dated Jan. 23, 2020, US-2020-0027919-A1, Apr. 5, 2022, U.S. Pat. No. 11,296,145.
Oct. 26, 2018, PCT/US18/057841, dated May 23, 2019, WO2019/099171.
Oct. 26, 2018, 201780097735.2, dated Jun. 15, 2020, dated Jul. 31, 2020, CN111479947A.
Dec. 29, 2017, 17826532.8, dated Jun. 26, 2020, dated Sep. 30, 2020, 3714080.
Dec. 29, 2017, 202047021124, dated May 19, 2020, dated Jun. 26, 2020, 202047021124A.
Dec. 29, 2017, U.S. Appl. No. 16/957,030, dated Jun. 22, 2020, Dec. 17, 2020, US-2020-0392644-A1.
Dec. 29, 2017, PCT/EP17/084833, dated Jul. 4, 2019, WO2019/129364.
Dec. 29, 2017, U.S. Appl. No. 17/135,632, dated Apr. 22, 2021, US-2021-0119125-A1, Aug. 23, 2022, U.S. Pat. No. 11,424,409.
Dec. 28, 2020, U.S. Appl. No. 16/246,287, dated Jul. 16, 2020, US-2020-0227636-A1, dated Dec. 29, 2020, U.S. Pat. No. 10,879,464.
Jan. 11, 2019, 2020211895, dated May 28, 2021.
Jan. 17, 2020, 202080009378.1, dated Jul. 15, 2021, dated Aug. 24, 2021, CN113302760A.
Jan. 17, 2020, 20705855.3, dated Jul. 9, 2021, dated Dec. 1, 2021, 3915152.
Jan. 17, 2020, 22167178.7, dated Aug. 17, 2022, 4044266.
Apr. 7, 2022, 22167181.1, dated Aug. 17, 2022, 4044267.
Apr. 7, 2022, 202147032428, dated Jul. 19, 2021, dated Jul. 23, 2021, 202147032428A.
Jan. 17, 2020, 10-2021-7022655, dated Jul. 16, 2021, dated Oct. 1, 2021, 10-2021-0118830.
Jan. 17, 2020, U.S. Appl. No. 17/332,908, dated Sep. 23, 2021, US-2021-0296560-A1.
May 27, 2021, U.S. Appl. No. 16/258,025, dated Jul. 30, 2020, US-2020-0243742-A1, dated Jun. 1, 2021, U.S. Pat. No. 11,024,792.
Jan. 25, 2019, PCT/US20/014202, dated Jul. 30, 2020, WO2020/154209.
Jan. 17, 2020, 2019459230, dated Dec. 2, 2021.
Jul. 29, 2019, 19748783.8, dated Jan. 19, 2022, dated Apr. 27, 2022, 3987077.
Jul. 29, 2019, 10-2021-7041226, dated Dec. 15, 2021, dated Mar. 28, 2022, 10-2022-0038286.
Jul. 29, 2019, U.S. Appl. No. 17/597,838, Jan. 25, 2022, Aug. 18, 2022, US-2022-0260915-A1.
Jul. 29, 2019, PCT/EP19/070387, Feb. 4, 2021, WO2021/018379.
Jul. 29, 2019, 20761683.0, Feb. 7, 2022, May 11, 2022, 3994838.
Aug. 11, 2020, U.S. Appl. No. 17/634,233, dated Feb. 9, 2022, dated Sep. 1, 2022, US-2022-0277216-A1.
Aug. 11, 2020, U.S. Appl. No. 62/885,715.
Aug. 12, 2019, PCT/US20/045791, dated Feb. 18, 2021, WO2021/030363.
Aug. 11, 2020, 19769791.5, dated Mar. 14, 2022, dated Jul. 27, 2022, 4032119.
Sep. 16, 2019, U.S. Appl. No. 17/753,820, dated Mar. 15, 2022, dated Oct. 20, 2022, US-2022-0336234-A1.
Sep. 16, 2019, PCT/EP19/074704, dated Mar. 25, 2021, WO2021/052559.
Sep. 16, 2019, 2019477015, dated Jun. 15, 2022.
Dec. 5, 2019, 201980102748.3, dated Jun. 2, 2022, dated Jul. 12, 2022, CN114747014A.
Dec. 5, 2019, 19817246.2, dated May 25, 2022, dated Oct. 12, 2022, 4070383.
Dec. 5, 2019, 202247030046, dated May 25, 2022.
Dec. 5, 2019, 2022-533642, dated Jun. 3, 2022.
Dec. 5, 2019, 10-2022-7017934, May 26, 2022, Aug. 4, 2022, 10-2022-0109400.
Dec. 5, 2019, U.S. Appl. No. 17/756,815, dated Jun. 2, 2022.
Dec. 5, 2019, PCT/EP19/083904, dated Jun. 10, 2021, WO2021/110274.
Dec. 5, 2019, 19817248.8, dated May 26, 2022, dated Oct. 12, 2022, 4070390.
Dec. 5, 2019, U.S. Appl. No. 17/756,813, dated Jun. 2, 2022.
Dec. 5, 2019, PCT/EP19/083906, dated Jun. 10, 2021, WO2021/110275.
Dec. 5, 2019, 2020395314, dated Jun. 15, 2022.
Dec. 4, 2020, 202080084194.1, dated Jun. 2, 2022, dated Jul. 22, 2022, CN114788026A.
Dec. 4, 2020, 20830437.8, dated May 26, 2022, dated Oct. 12, 2022, 4070391.
Dec. 4, 2020, 202247030042, dated May 25, 2022.
Dec. 4, 2020, 2022-530890, dated May 26, 2022.
Dec. 4, 2020, 10-2022-7021272, dated Jun. 22, 2022, dated Aug. 4, 2022, 10-2022-0109419.
Dec. 4, 2020, U.S. Appl. No. 17/561,330, dated May 12, 2022, US-2022-0149262-A1.
Dec. 23, 2021, U.S. Appl. No. 16/796,671, Jun. 10, 2021, US-2021-0175408-A1, Dec. 28, 2021, U.S. Pat. No. 11,211,543.
Feb. 20, 2020 U.S. Appl. No. 62/944,093.
Dec. 5, 2019, PCT/US20/063459, dated Jun. 10, 2021, WO2021/113746.
Dec. 4, 2020, 2014347.5.
Sep. 11, 2020, PCT/EP20/081723, dated Mar. 17, 2022, WO2022/053170.
Nov. 11, 2020, PCT/EP20/084618, dated Jun. 9, 2022, WO2022/117206.
Dec. 4, 2020, PCT/EP21/050587, dated Jul. 21, 2022, WO2022/152373.
Jan. 13, 2021, PCT/US21/045075.
Aug. 6, 2021, 111138415.
Oct. 11, 2022, PCT/US21/059005.
Nov. 11, 2021, 111138209.
Oct. 7, 2022, PCT/US21/058734.
"Office Action Issued in Korean Patent Application No. 10-2020-7002956", dated Nov. 7, 2022, 7 Pages.
"Notice of Allowance Issued in Japanese Patent Application No. 2019-571656", dated Dec. 6, 2022, 5 Pages.
"Office Action Issued in Australian Patent Application No. 2018367378", dated Nov. 28, 2022, 3 Pages.
"Notice of Allowance Issued in Korean Patent Application No. 10-2020-7002956", dated Feb. 20, 2023, 8 Pages.
"Office Action Issued in Chinese Patent Application No. 201780092102.2", dated Mar. 13, 2023, 22 Pages.

* cited by examiner

1) Deposition of dielectric mask including pillars for shadow mask

2) Selective area semiconductor growth

3) Superconductor growth/deposition including shadow mask

SUPERCONDUCTOR-SEMICONDUCTOR FABRICATION

CROSS REFERENCE TO RELATED APPLICATIONS

This is the U.S. National Stage of International Application No. PCT/EP2017/081038, filed Nov. 30, 2017, which was published in English under PCT Article 21(2), which in turn claims the benefit of U.S. Provisional Application No. 62/527,875, filed Jun. 30, 2017, and also claims the benefit of GB Provisional Application No. 1718897.0, filed Nov. 15, 2017. The provisional applications are incorporated herein in its entirety.

FIELD

This application relates to the fabrication of superconductor-semiconductor platforms, such as semiconductor-superconductor platforms for use in quantum computers.

Background

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. Regarding the latter, a key advance in the field was the realization that non-abelian anyons, in the form of "Majorana zero modes" (MZMs) can be formed in semiconductor (SE) nanowires (NWs) coupled to a superconductor (SU).

One of the issues encountered in the context of SE/SU nanowires is the existence of so-called "soft gap" states. The soft gap issue been documented in publically-available literature, and suffice it to say that these soft gap states, when present, are a source of decoherence for the MZMs. Analysis and experiments indicate that a source of the soft gap is disorder in the SE/SU interface, and there has been recent work in the field on improving the quality of the SE/SU interface with the aim of providing more stable MZMs.

SUMMARY

Whilst recent developments in fabrication technology have led to significant improvements in the quality of the SE/SU interface in SE/SU nanowires, the approaches in question are all facing challenges with scalability. This imposes limits on the size and complexity of the SE/SU nanowire networks that can be fabricated with these approaches. Examples are given later to provide context.

Embodiments of the present technology provide methods of fabricating SE/SU nanowire structures, which can not only produce high-quality SE/SU interfaces but can also do so in a scalable manner to allow the production of large and potentially complex SE/SU nanowire networks. This is achieved through a combination of selective area grown (SAG) semiconductor technology with superconductor deposition/growth (note, the terms "selected area growth" and "selective area growth" are used interchangeably herein).

A first aspect of the present technology is directed to a method of fabricating a mixed semiconductor-superconductor platform, the method comprising the following steps. In a masking phase, a dielectric mask is formed on a substrate, such that the dielectric mask leaves one or more regions of the substrate exposed. In a selective area growth phase, a semiconductor material is selectively grown on the substrate in the one or more exposed regions. In a superconductor growth phase, a layer of superconducting material is formed, at least part of which is in direct contact with the selectively grown semiconductor material. The mixed semiconductor-superconductor platform comprises the selectively grown semiconductor material and the superconducting material in direct contact with the selectively grown semiconductor material.

In embodiments, the semiconductor material in the one or more exposed regions may form a network of in-plane nanowires.

The layer of superconducting material may be epitaxially grown in the superconductor growth phase.

The superconducting material may be epitaxially grown using molecular beam epitaxy (MBE).

The layer of superconducting material may be formed, in the superconductor growth phase, using a beam.

The beam may have a non-zero angle of incidence relative to the normal of a plane of the substrate.

The particle beam may be angled relative to the substrate, such that the beam is incident on one side of a structure protruding outwardly of the plane of the substrate, thereby preventing a shadow region on the other side of the protruding structure from being covered with the superconductor material.

The protruding structure may be a protruding portion of the semiconductor material, such that the shadow region separates the semiconductor material from a portion of the superconductor material deposited in a gating region.

The method may comprise: removing semiconductor material from the gating region; and forming a gate, from a gating material, in the gating region.

The protruding structure may be formed of dielectric material.

The protruding structure may be adjacent a nanowire formed by the semiconductor material, the shadow region extending across the width of the nanowire such that a section of the nanowire is not covered by the superconductor material across its entire width, thereby forming a junction between two further sections of the nanowire, both of which are at least partially covered by the superconductor material.

The selective area growth phase and the superconductor growth phase may be performed in a vacuum chamber, with the substrate remaining in the vacuum chamber throughout and in between those phases.

Another aspect of the present technology provides a quantum circuit, comprising: a selective area grown (SAG) semiconductive region; and a superconducting region.

In embodiments, the SAG semiconductive region may comprise conducting in-plane nanowires.

The in-plane nanowires may be tunable.

The in-plane nanowires may be tunable via a side gate, top gate, or bottom gate.

The superconducting region may comprise superconductor material in direct contact with semiconductor material of the SAG semiconductive region.

The quantum circuit may comprise an insulating substrate on which the SAG semiconductive region was grown and a dielectric mask formed on the insulating substrate, the superconducting region formed of superconductor material selectively grown on one or more regions of the substrate that are not covered by the dielectric mask.

Another aspect of the present technology provides a topological quantum computer comprising: a network of selective area grown (SAG) nanowires; and a layer of superconductor material formed on the SAG nanowires. The network of SAG nanowires and the superconductor material are coupled so as to provide Majorana modes for use in performing quantum computations.

In embodiments, the topological quantum computer may comprise at least one gate arranged for manipulating the Majorana modes.

Another aspect of the technology provides a method, comprising: generating a mixed semiconductor-superconductor platform for performing quantum computing. The generating comprises: depositing a superconductor layer on a substrate; removing one or more regions of the deposited superconductor region; and growing one or more selective area grown semiconductive regions in the removed regions of the deposited superconductor regions.

In embodiments, the growing the one or more selective area grown semiconductive regions comprises forming nanowires that can be tuned with a side gate, top gate, and/or a bottom gate.

Another aspect of the technology provides a method, comprising: generating a mixed semiconductor-superconductor platform for performing quantum computing, wherein the generating comprises: growing one or more superconductor layers on a substrate; growing one or more selective area grown semiconductive regions on the substrate in regions of the substrate unoccupied by the one or more superconductor layers.

In embodiments, the growing the one or more selective area grown semiconductive regions comprises forming nanowires that can be tuned with a side gate, top gate, and/or a bottom gate.

Another aspect of this disclosure provides a method of fabricating a mixed semiconductor-superconductor platform, the method comprising: forming a semiconductor structure on a substrate; forming at least one protruding dielectric structure; and using a beam to form a layer of superconducting material, at least part of which is in direct contact with the semiconductor structure, wherein the beam is angled relative to the protruding dielectric structure such that the beam is incident on one side of the protruding dielectric structure, thereby preventing a shadow region on the other side of the protruding dielectric structure from being covered with the superconductor material.

BRIEF DESCRIPTION OF FIGURES

For a better understanding of the present technology, and to show how embodiments of the same may be carried into effect, reference is made by way of example only to the following figures in which.

DETAILED EMBODIMENTS OF THE DISCLOSED TECHNOLOGY

Epitaxial semiconductor-superconductor materials are a promising platform for gatable low-dissipation superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for gatable superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons. Regarding the latter approach, this has been able to achieve a very high quality SE/SU interface. However, with this approach, the SE/SU nanowires to form part of a network have to be individually grown and, once grown, individually placed on an insulating material to form the actual network. Thus, scaling up this approach to larger networks presents very significant challenges.

Example embodiments of the disclosed technology provide a solution to the problem of scalability by combining SAG semiconductors with a superconducting phase.

Figure 1:
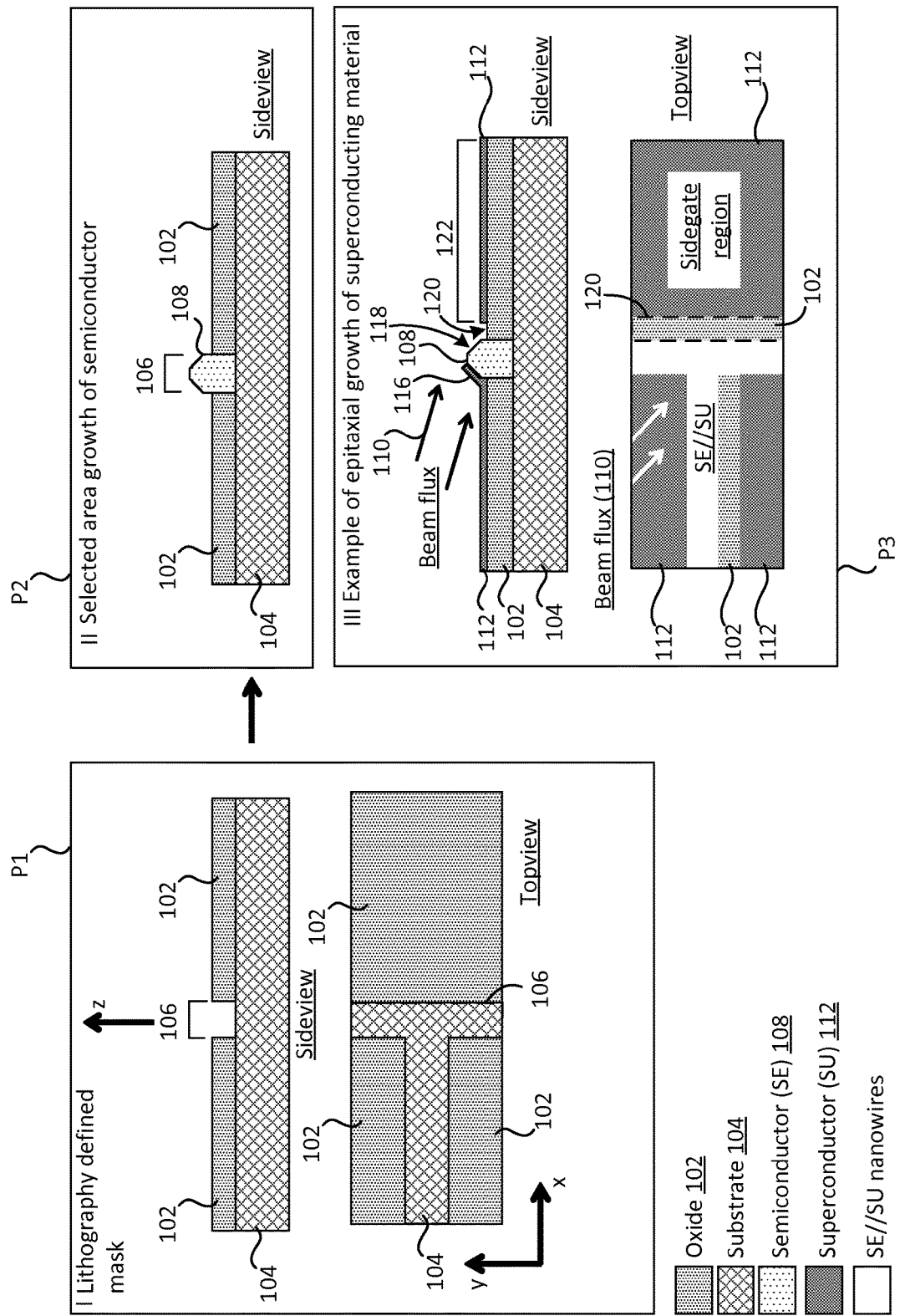
FIG. 1 shows a schematic illustration of a method of fabricating a network of SE/SU nanowires.

With reference to FIG. 1, an example three-phase fabrication method will now be described. The fabrication method can be used to create a network of SE/SU nanowires, which in turn can for example form the basis of a quantum circuit (e.g. for a quantum computer) or other mixed semiconductor-superconductor platform. In particular, the method is particularly suitable for fabricating a SE/SU nanowire network capable of hosting stable MZMs, with no or significantly reduced soft gap decoherence, which can form the basis of fault-free topological quantum computations.

It is noted, however, that although the material platform is relevant for quantum computing, the gatable superconducting electronics it provides may well have other applications outside of or which are not directly related to quantum computing, particularly in contexts where low energy dissipation is required.

As will become apparent, because the SE/SU nanowire network is created using SAG, an entire nanowire network can be fabricated as a whole on an insulating substrate. The insulating substrate and the nanowire can incorporated directly into the final product, without any need to transfer the nanowires to a different surface. Thus the method is significantly more saleable than the existing approaches.

1) Masking Phase

In a first phase P1 (masking phase) a patterned layer of dielectric material 102 (dielectric mask) is formed on top of an insulating substrate 104. A side-view and a top-view of the substrate 104 with the dielectric mask 102 are shown on the left hand side of FIG. 1. The substrate 104 can be formed of any suitable substrate material such as InP (Indium Phosphide), and is an insulating substrate in the described examples. In the described examples, the dielectric material 102 is an oxide but it can be any dielectric material that facilitates SAG in a second phase P2 of the fabrication method (see below).

The oxide layer is patterned in that the oxide layer 102 is formed so as to leave narrow strips of the substrate—in a desired region 106—exposed (i.e. not covered by the oxide 102). The pattern in this context refers to the structure of the desired region 106, which will ultimately become the structure of the nanowire network, as it is this exposed region 106 in which SE nanowires are grown. Accordingly, the size and structure of the nanowires matches the size and structure of the exposed region 106. Although only one exposed region 106 is shown in FIG. 1, nanowires can be grown simultaneously in multiple regions and all description pertaining to the desired region 106 applies equally to multiple such regions. Accordingly, the structure of an entire nanowire network can be defined by the structure of the exposed region(s). In this example, the strips and hence the resulting nanowires have a width of the order of tens or hundreds of nanometers.

The oxide layer 102 can be formed so as to leave the desired region 106 exposed in any suitable manner. For example, a uniform, continuous layer of oxide can be deposited on the substrate 104, and the exposed region 106 can then be formed by selectively etching away the oxide 102 from the desired region 106 (in this case, it is the etching that defines the eventual nanowire network structure). As another example, the oxide layer 102 can be selectively deposited on the substrate 104 with a mask used to prevent deposition of the oxide 102 in the desired regions 106 (in this case, it is the mask that defined the eventual nanowire network structure).

The SAG nanowires are defined along high symmetry in-plane crystal orientations on the substrate, which also gives well-defined faceting of the nanowires. This makes the SU/SE interface flat, potentially atomically flat, and well defined.

2) SAG Phase

In the second phase P2, namely the SAG phase, a semiconductor material 108 is selectively grown within the desired regions 106, on top of the exposed portion of the substrate 104. An example is illustrated at the top right of FIG. 1, at which a side-view of the substrate 104 is shown. Due to the patterning of the oxide layer 102, the selectively grown semiconductor 108 forms in-plane nanowires (that is, nanowires lying in the place of the substrate 104).

SAG is a growth method using crystal growth vacuum chambers. SAG refers to localized growth of semiconductor in exposed regions of the substrate, with growth conditions selected to prevent such growth on the dielectric mask itself. This can be based on Chemical Beam Epitaxy (CBE), Molecular Beam Epitaxy (MBE), or Metal-Organic Chemical Vapour Deposition (MOCVD), for example. In the context of semiconductors, SAG refers to a particular class of epitaxial semiconductor growth (and is also referred to as selective area epitaxy), in which a patterned dielectric mask is used to define the intended structure of the semiconductor material to be grown (a form of lithography). The SAG process is tuned such that semiconductor growth occurs only on regions of the substrate that are not covered by the dielectric mask, and not on the dielectric mask itself. This is quite different from other deposition/growth processes, such as bottom up growth (in which no mask is used) and uniform deposition (epitaxial or otherwise) in which material is uniformly deposited across a surface irrespective its material composition (as in phase P3—see below). SAG is conducted in a high or ultra-high vacuum, and requires careful tuning to achieve the desired selective semiconductor growth.

Any suitable SAG process can be used in the second phase P2 to create the desired SE nanowires in the exposed region 106.

SAG per-se is known and is therefore not discussed in further detail herein. For further description of SAG, see, e.g., G. J Davies *Proc. SPIE* 2140, Epitaxial Growth Processes, 58 (May 11, 1994); doi:10.1117/12.175795; M Fahed, Doctoral thesis: Selective area growth of in-plane nanostructures using molecular beam epitaxy, 2016. http://www.theses.fr/2016LIL10114; Fukui et al., Appl. Phys. Lett. 58, 2018 (1991); doi: https://doi.org/10.1063/1.105026.

Suffice it to say that the SAG phase P2 is such that, at the end of that phase, the semiconductor material 108 fills the desired region 106 (that is, the region 106 in which the substrate 104 is not covered by the oxide mask 102) but does not extend, in the plane of the substrate 104 (xy-plane hereafter), beyond the boundaries of the desired region 106 as defined the oxide layer 102. However, as can be seen, it does extend outwardly in a direction normal (perpendicular) to the plane of the substrate 104 (z-direction hereafter) so as to protrude outwardly of the oxide mask 102. That is, the semiconductor material 108 extends a greater distance from the substrate 104 than the oxide layer 102 in the z-direction. In this manner, the semiconductor material 108 forms nanowires lying substantially in the plane of the substrate 102 (in-place nanowires).

The semiconductor material 108 can be any suitable semiconductor material, such as Indium arsenide (InAs). The SAG semiconductor 108 can for example be confined 2 DEG (two-dimensional electron gas) semiconductor or single material semiconductor.

3) Superconductor Growth Phase

In a third phase P3 (superconductor growth phase) a layer of superconducting material 112 is grown using a particle beam 110. Herein, a superconducting material means a material that exhibits superconducting properties at least under certain conditions. An example of such a material is aluminum (Al). In the following examples, the superconductor is grown epitaxially in phase P3, and the superconductor growth phase P3 may be referred to as an epitaxial growth phase in this context. However, the technology is not limited in this respect, and it may be possible to achieve the intended result via non-epitaxial superconductor growth in phase P3.

The superconducting material 112 can be grown in phase P3 using molecular beam epitaxy (MBE) electron gun epitaxy, for example.

At least part of the superconductor layer 112 is deposited on top of the SE nanowire 108 such that this part of the superconductor layer 112 (labelled 116 in FIG. 1) is in direct contact with the SE nanowire 108. That is, such that the SE nanowire 108 is at least partially covered with superconducting material.

This is also a form of epitaxy, but it is not SAG. In particular, in the epitaxial growth phase P3, epitaxial growth does occur on the oxide layer 102, as well as on the SE nanowires 108.

The beam can be angled in substantially the z-direction such that essentially all of the exposed surfaces of the oxide layer 102 and the SE material 108 are covered by the SU layer 112. However, in this example, the particle beam 110 is incident on the substrate 104 with a non-zero angle of incidence relative to the z-direction (deposition angle). As a consequence of this non-zero deposition angle and the protruding structure of the SE nanowire 108, the SE nanowire 108 is only partially coated by the superconductor layer 112; that is, a part of the SE nanowire (labelled 118) is not coated by the superconductor material. The bulk of the oxide layer 102 is also coated by the superconductor layer 112, however due to the angle of the incoming beam 110 and the protruding structure of the SE nanowires 108, small regions of the oxide layer 102 (shadow regions) immediately adjacent the protruding SE nanowires 108 are left exposed, i.e. not coated by the SU material. One such shadow region is labelled 120 in FIG. 1. The shadow region 120 separates the SE material 108 from a portion of the SU layer 112 in a "sidegate" region 122. The portion of the SU layer 112 in the sidegate region 122 can be used to form a gate for controlling the SE nanowires 108, or (more likely) the SU material can be etched away from this region and replaced with a more suitable gate material, as in the example below. Either way, the shadow gap 120 ensures the gate operates as intended. Forming the gap 120 using such "in-situ" patterning in the SU epitaxy phase P3 (as described above) ensures that material does not need to be etched away too close to the delicate nanowires 108.

This is an example of the basic process where the superconductor is deposited as a uniform layer, but where a "shadow" from the selective area grown material is used to form a gap between the semiconductor and the superconductor. In this particular case, the superconductor, that does not touch the semiconductor, can be used as a side gate or etched away and replaced with a more suitable gate material, while the superconductor that are in direct contact with the semiconductor are used to induce superconductivity.

The bottom right of FIG. 1 shows both a side-view and a top-view of the substrate 104 at the end of the third phase P3. Note that, in the top-view, the part 116 of the superconductor layer 112 that partially coats the SE nanowire 108 is not distinguished from the uncoated part 118 of SE nanowires 108; rather the combined nanowire structure formed of the nanowires 108 and the portion of the superconductor material 116 that (partially) covers those nanowires (i.e. that is in direct contact therewith) is depicted as a single element, labelled SE//SU. This combined structure is similarly represented and labelled in later figures, and herein references to "SE/SU nanowires" or "SE//SU nanowires" refer to the SE nanowires 108 and the SU material 116 that (partially) covers the SE nanowires 108, unless otherwise indicated.

Figure 2:
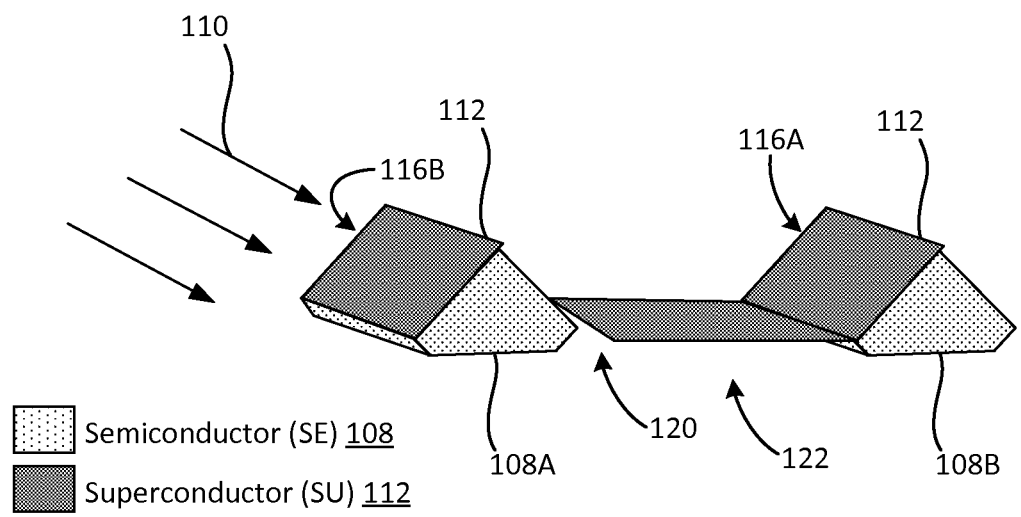
FIG. 2 shows a schematic perspective view of SAG SE nanowires in an epitaxial growth phase, in which superconducting material is deposited on and around the nanowires.

To further aid illustration, FIG. 2 shows a schematic perspective view of first and second nanowires 108A, 108B during the third phase P3, which are partially coated by respective parts 116A, 116B of the superconductor layer 112. A shadow gap 120 of the kind described above is shown, which is immediately adjacent the first nanowire 108A and separates the first nanowire 108A from a portion of the semiconductor layer 112 in a sidegate region 122, in the manner described above.

The SAG phase P2 and superconductor growth phase P3 can be conducted in a vacuum chamber, preferably without moving the substrate 104 between phases. These phases can be carried out under high vacuum or ultra-high vacuum conditions ($\sim 10^{-8}$-$10^{-12}$ Torr or less), and those vacuum conditions may be maintained between phases. Among other things, this ensures a clean SE/SU interface, free from unwanted impurities.

As will be appreciated, both the SAG semiconductor growth of phase P2 and the superconductor growth of phase P3 require carefully calibrated conditions to get within respective "growth windows" for these two phases, and thereby achieve the desired semiconductor and superconductor growth respectively. Depending on the material type, the growth conditions, temperature and flux needs to chosen carefully. For example, for MBE (which can be used in both the semiconductor SAG phase P2 and superconductor growth phase P3), the substrate generally needs to be heated to temperatures of around 500° C. or more to clean the surface for native oxide. However, in the SE SAG growth phase P2 and SU growth phase P3, the respective temperature windows in which the desired growth takes place is dependent on the composition of the SE material 108 and SU material 112 respectively. The superconductor is grown/deposited in-situ, without breaking vacuum. In this way the surface of SAG is not oxidized in air and remain clean until the SU is put on, which ensure a clean SE-SU interface.

Example Use-Cases

Using SAG as a basis for gatable superconductor network desirably involves an insulated substrate, and that the selective area grown material can carry induced superconductivity.

The substrate 104 and oxide layer 102 on which the SE//SU nanowire network is grown can be incorporated in the end-product, such as a quantum circuit or quantum computer, along with the SE/SU nanowire network, without transferring the nanowires from the substrate on which they were originally fabricated.

Embodiments of the disclosed technology include topologically protected quantum computing circuits that comprise networks of nanowires formed using such mixed semiconductor and superconductor regions.

Figure 3:
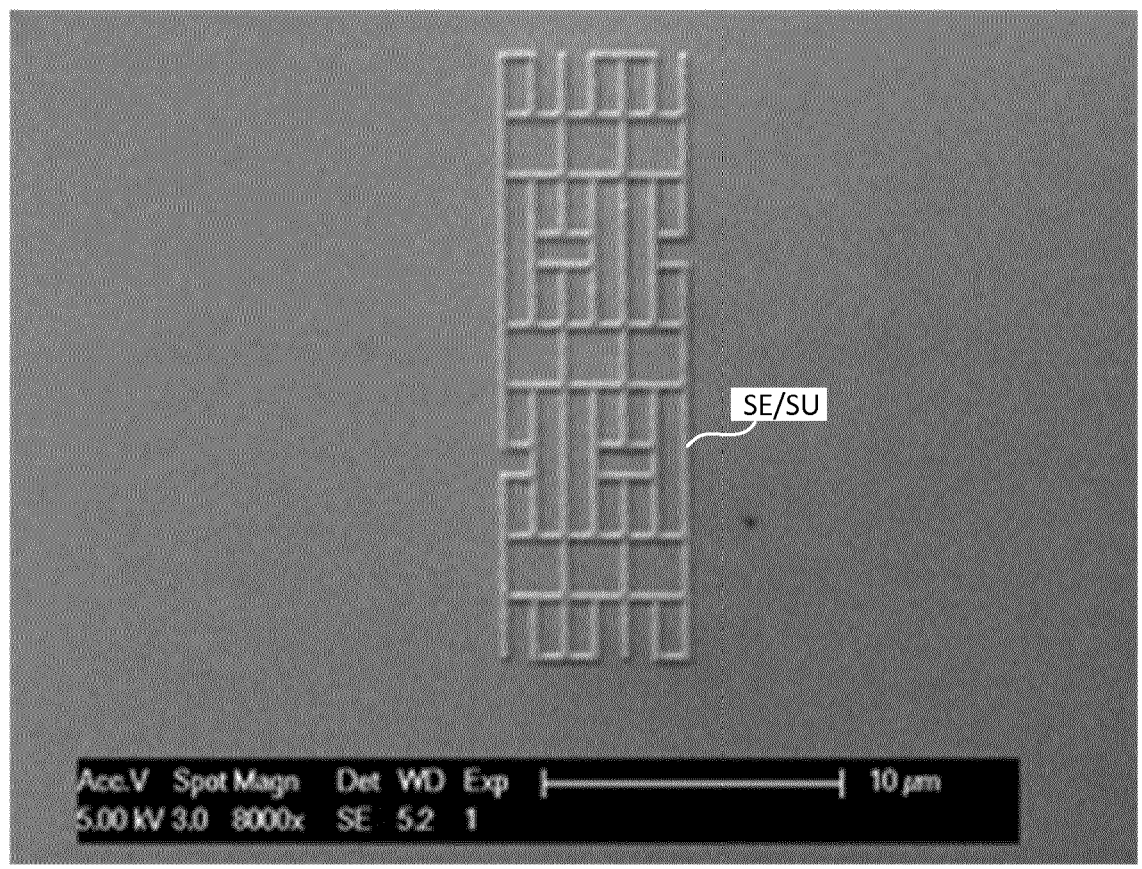
FIG. 3 shows a top view image of a SAG InAs nanowire network on an InP substrate.

In FIG. 3, for instance, a wire-pattern consisting of InAs nanowires grown on an insulating InP substrate is shown. In particular, FIG. 3 shows the fabrication of a complicated network based on one-dimensional nanowire network. The network is a SAG InAs nanowire network formed on an InP substrate.

Figure 4:
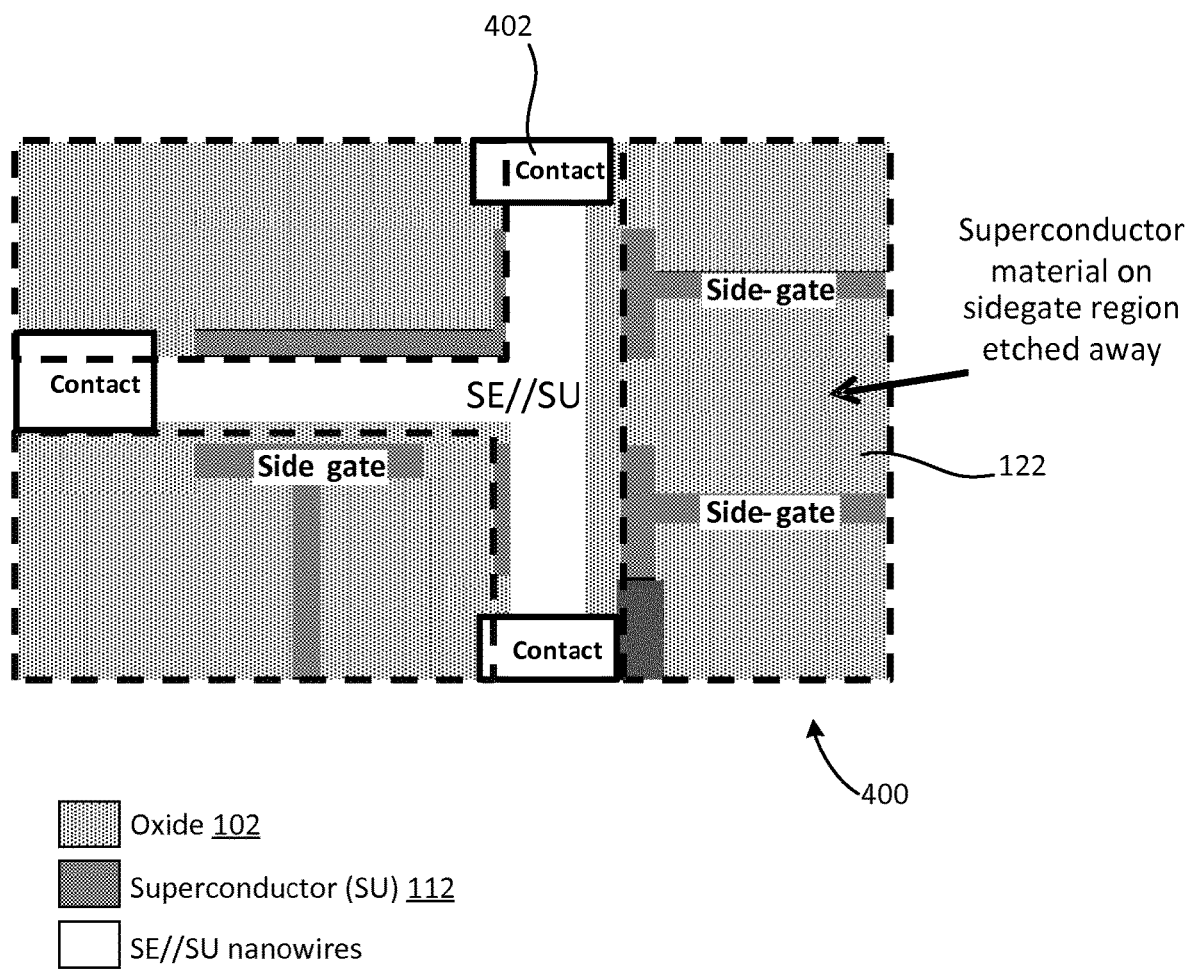
FIG. 4 shows a schematic top view of a quantum circuit comprising SE/SU nanowires and sidegate regions.

FIG. 4 shows a schematic top-view of a T-shaped SE//SU nanowire structure, which has been fabricated using the method described above, to form a quantum circuit 400. Contacts 402 of the quantum circuit 402 have been added to the SE//SU nanowires, to allow electrical connection therewith. Gating regions 112 are shown, in which most of the SU material 112 has been etched away, e.g. to be replaced with a different gating material (not shown), in order to form a side gate for manipulating the SE//SU nanowires, and—in the context of topological quantum computing, for example—for manipulating Majorana zero modes hosted by the SE//SU nanowires, in order to perform quantum computations.

Figure 5:
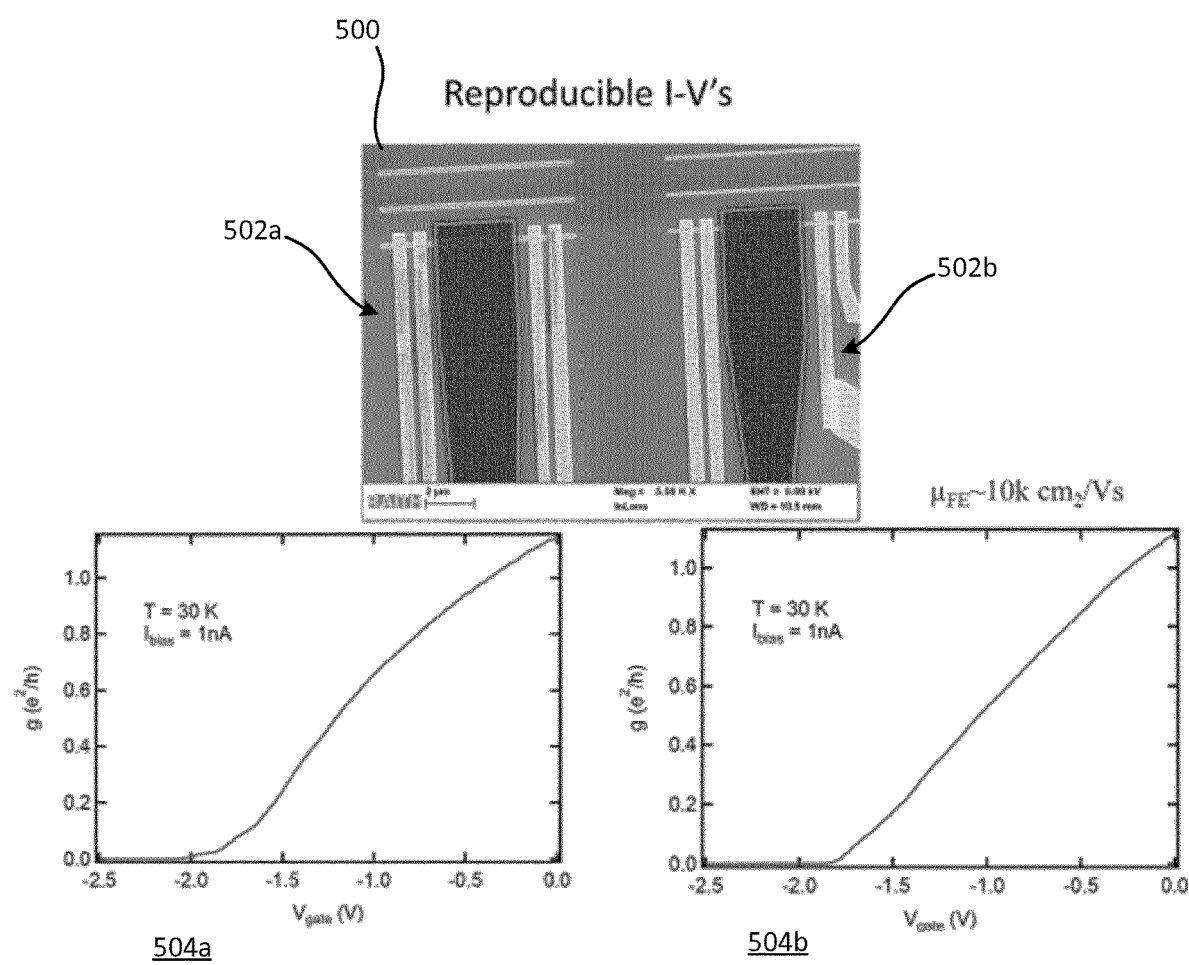
FIG. 5 shows respective I-V graphs as measured for two SAG nanowires fabricated using the described method.

FIG. 5 shows a top-view image 500 of two matching, side-by-side example SE/SU nanowire structures 502a, 502b, fabricated according to the described method. Here, contacts (bright vertical lines) and top-gates (dark vertical line) can be seen applied to SAG nanowires (bright horizontal lines). These can be added using lithography methods, for example.

FIG. 5 also shows respective I-V (current-voltage) graphs 504a, 504b for the matching structures 502a, 502b respectively. As can be seen, the two SE/SU nanowire structures 502a, 502b exhibit very similar I-V characteristics. This demonstrates one of the benefits of the fabrication method, namely reproducibility, i.e. the ability to produce nanowire structures with consistent physical characteristics. This level of reproducibility represents a significant improvement with respect to existing nanowire fabrication methods.

Extension—In-Situ Patterning

Figure 6:
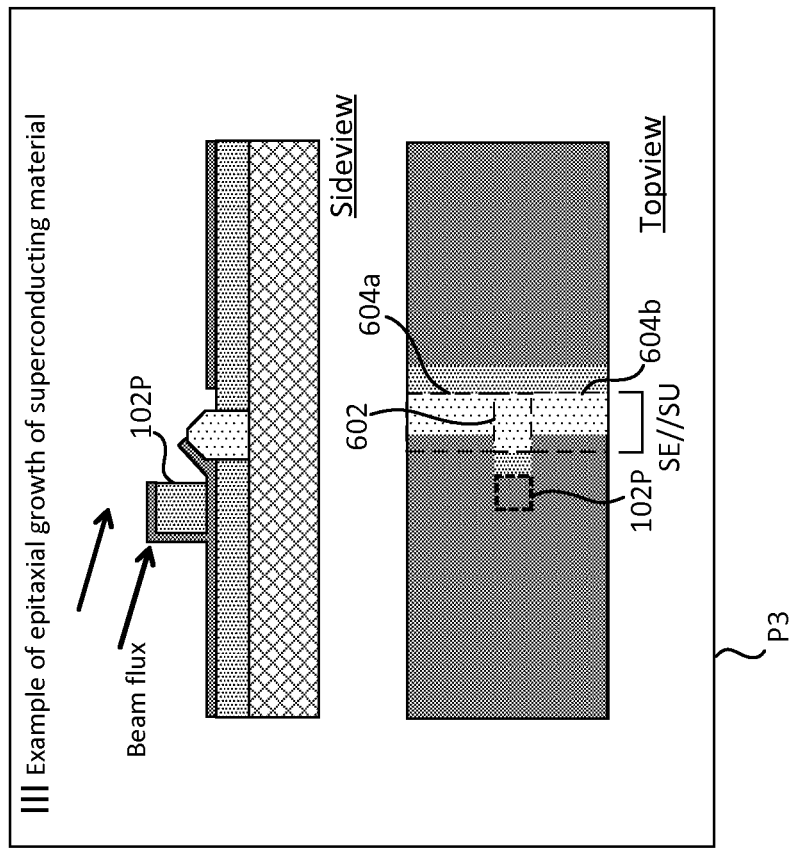
FIG. 6 schematically illustrates an extension of the fabrication method, in which in-situ patterning is used to create additional structure.
Figure 6:
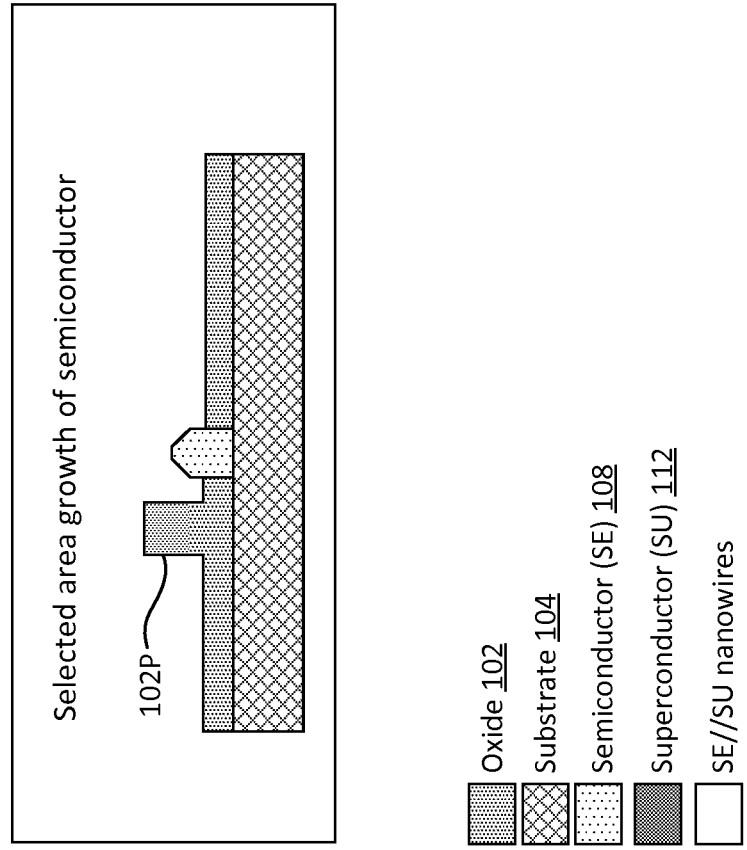
Figure 7:
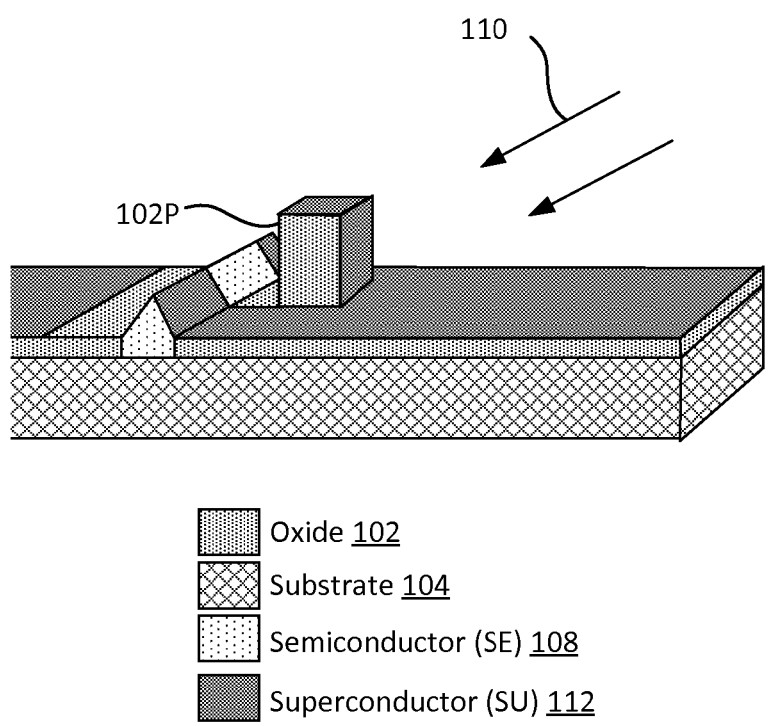
FIG. 7 shows a schematic perspective view to illustrate an example of in-situ patterning used to create a junction.

FIGS. 6 and 7 schematically illustrate one example of an extension of the method of FIG. 1, in which protruding dielectric structure 102P is used, in conjunction with an angled beam 110 in the superconductor growth phase P3, to perform in-situ patterning. The principle is similar to the in-situ patterning provided by the protruding SE material 108, in that the protruding dielectric structure 102P selectively obstructs the angles beam to prevent deposition of the SU material 112 from occurring in certain shadow regions of the kind described.

In this example, the protruding dielectric structure 102P is a "pillar" of dielectric material located adjacent a SE nanowire 108, so as to provide a shadow region 602 extending across the entire width of the nanowire 108, such that the nanowire 108 is entirely uncoated with SU material in this region 602 across its entire width. This uncoated portion 602 thus forms a SE junction between two sections 604a, 604b of SE/SU nanowire. This is shown in the side and top views of FIG. 6, and the perspective view of FIG. 7.

Figure 8:
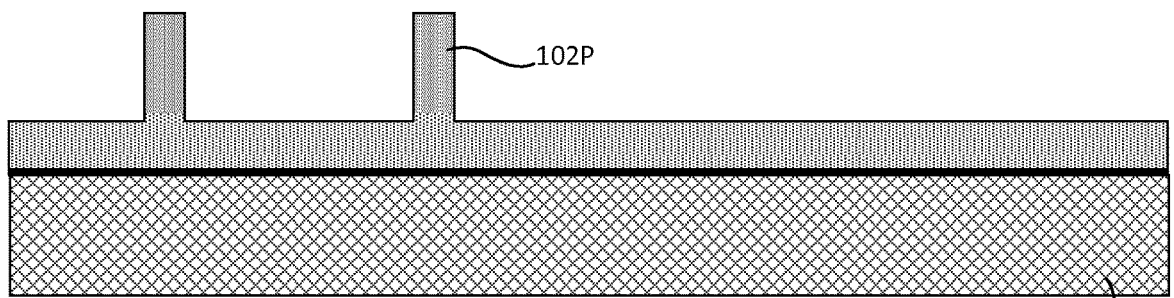
FIG. 8 shows a schematic side view of a substrate in another example of in-situ patterning.
Figure 8:
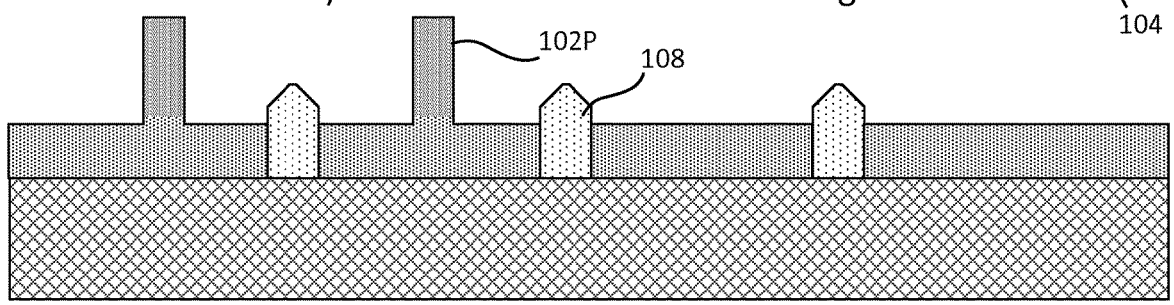
Figure 8:
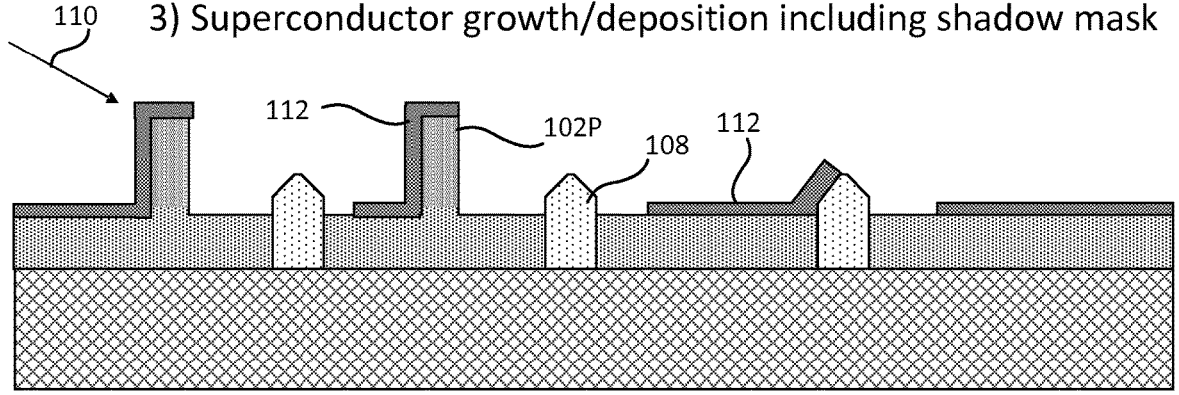
Figure 9:
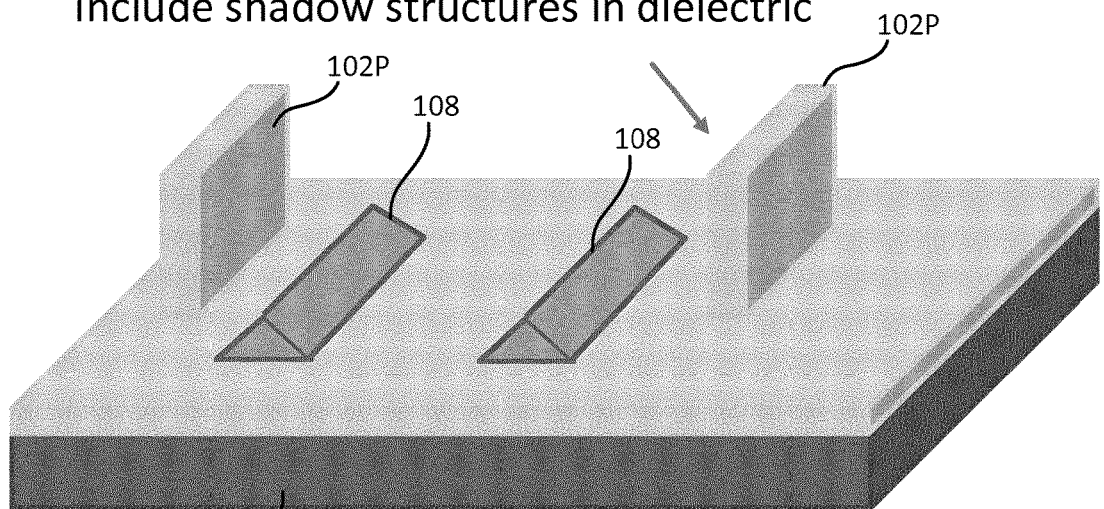
FIGS. 9 and 10 shows schematic perspective views of a substrate in yet another example of in-situ patterning.
Figure 10:
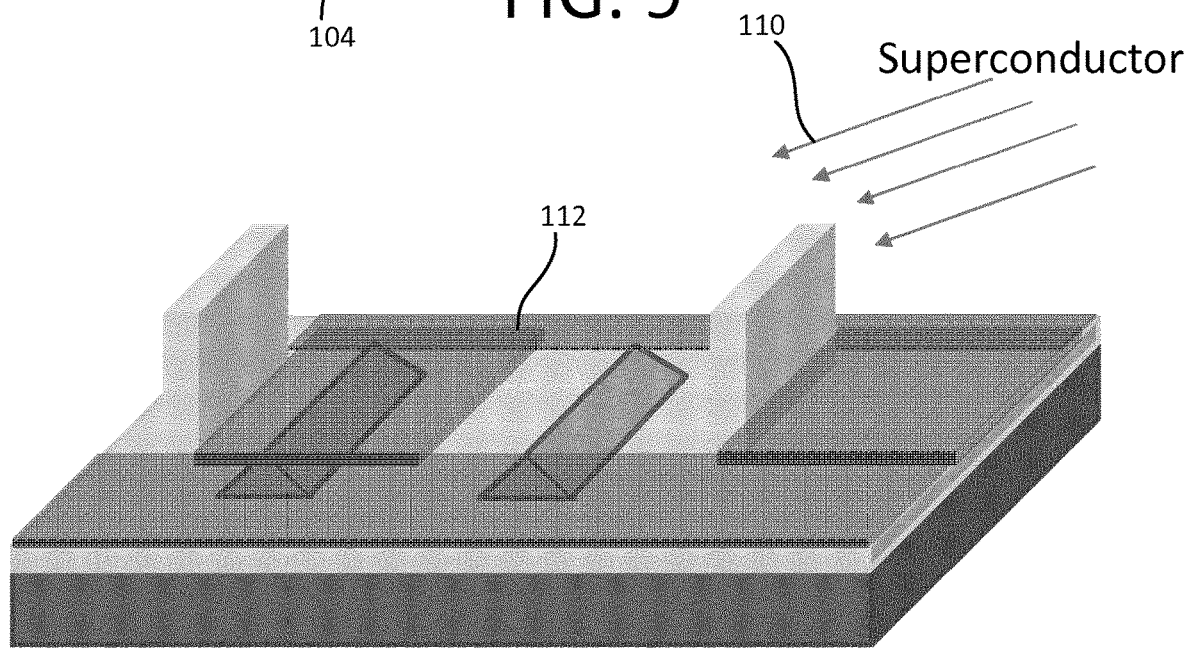

As illustrated in FIGS. 8-10, multiple protruding dielectric structures 102P can be used to achieve any desired in-situ patterning.

As will be appreciated, this is not limited to the formation of junctions, and protruding dielectric structures (e.g. walls, pillars, loops etc.) can be used, individually or in combination, to achieve any desired patterning of the SU material, according to the principles set out above.

Further Example Use-Cases

Figure 11:
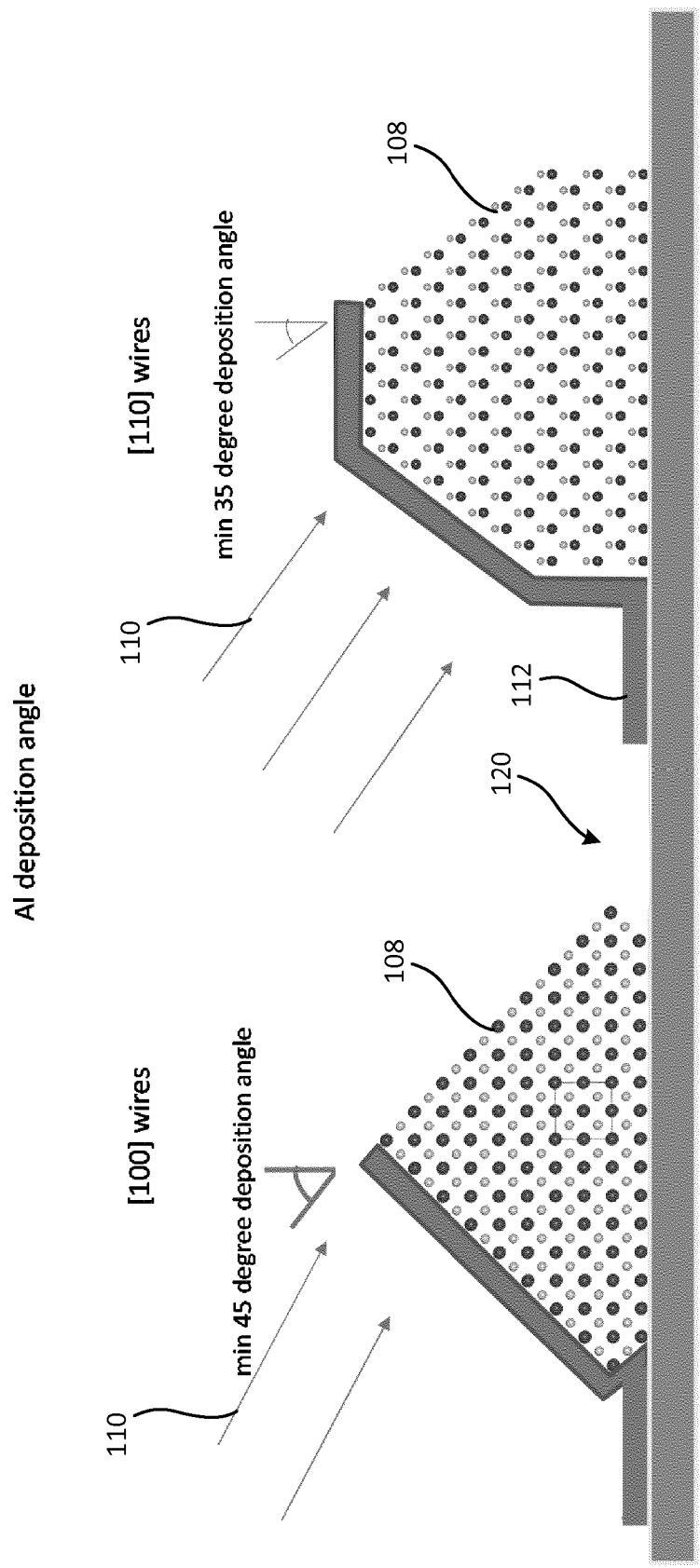
FIG. 11 shows a cross-section view of nanowires having different Miller indices.

FIG. 11 illustrates two crystalline nanowire structures that may be found in certain types of quantum circuit, namely a "[100]" SE/SU nanowire and a "[110]" SE/SU nanowire. Here, [100] and [110] are Miller indices, which in this context refer to the orientation of a nanowire's crystalline structure relative to the nanowire orientation itself. As can be seen, different miller indices result in the growth of different shaped nanowires in the SAG phase P2. In particular, an SAG [100] wire has an essentially triangular profile when a cross-section is taken across their width, whereas an SAG [110] wire has a flatter portion at its top. On account of the different profiles, in the epitaxial growth phase P3, the angle of the particle beam 110 is preferably selected in dependence on the miller index of the SAG nanowire(s). For [110] nanowires, an angle of at least 45 digress relative to the z-axis may be suitable, whereas for [100] nanowires, an angle of at least 35 degrees may be appropriate.

Figure 12:
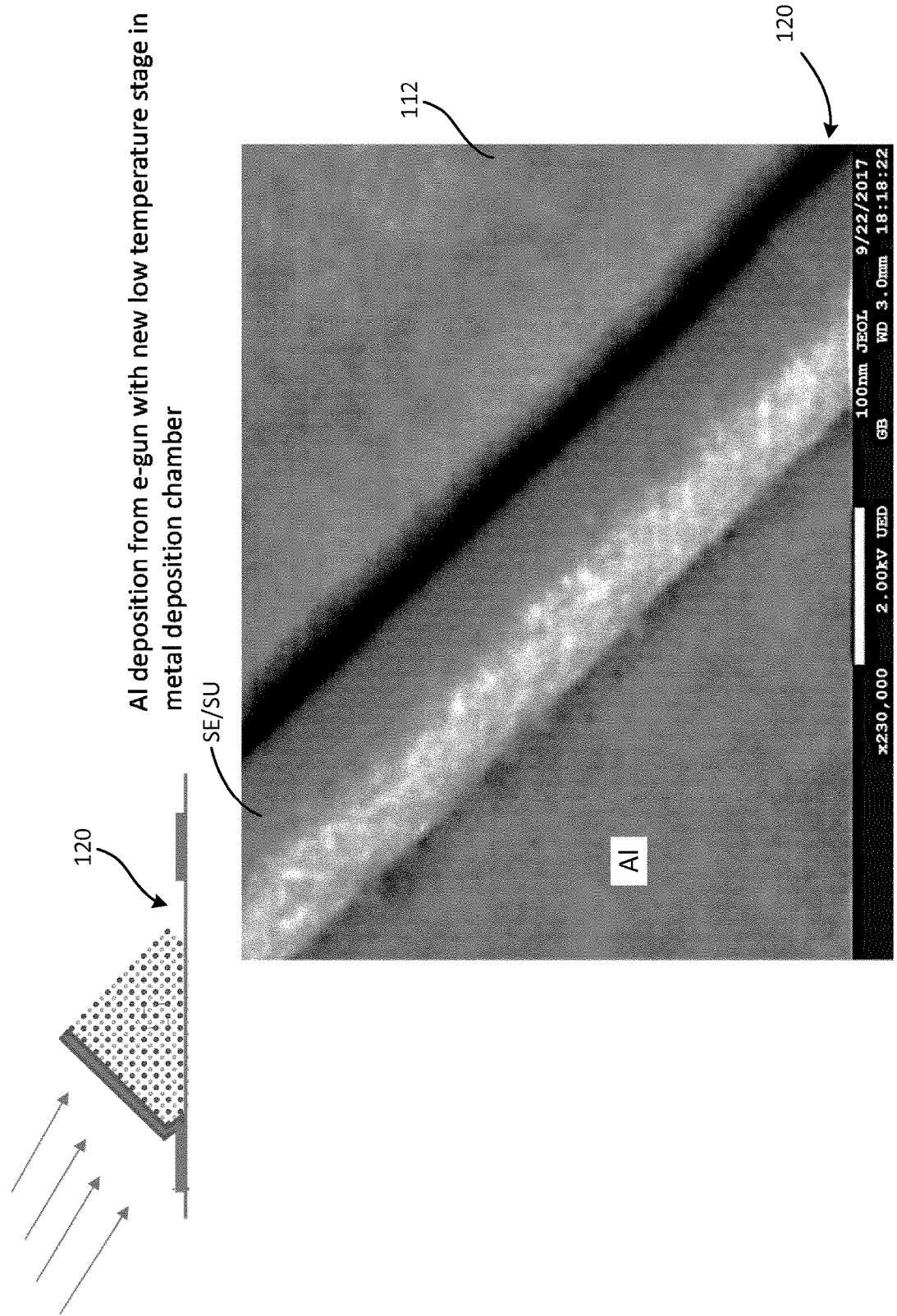
FIG. 12 shows an image of a [100] nanowire coated with superconductor at a first deposition angle.
Figure 13:
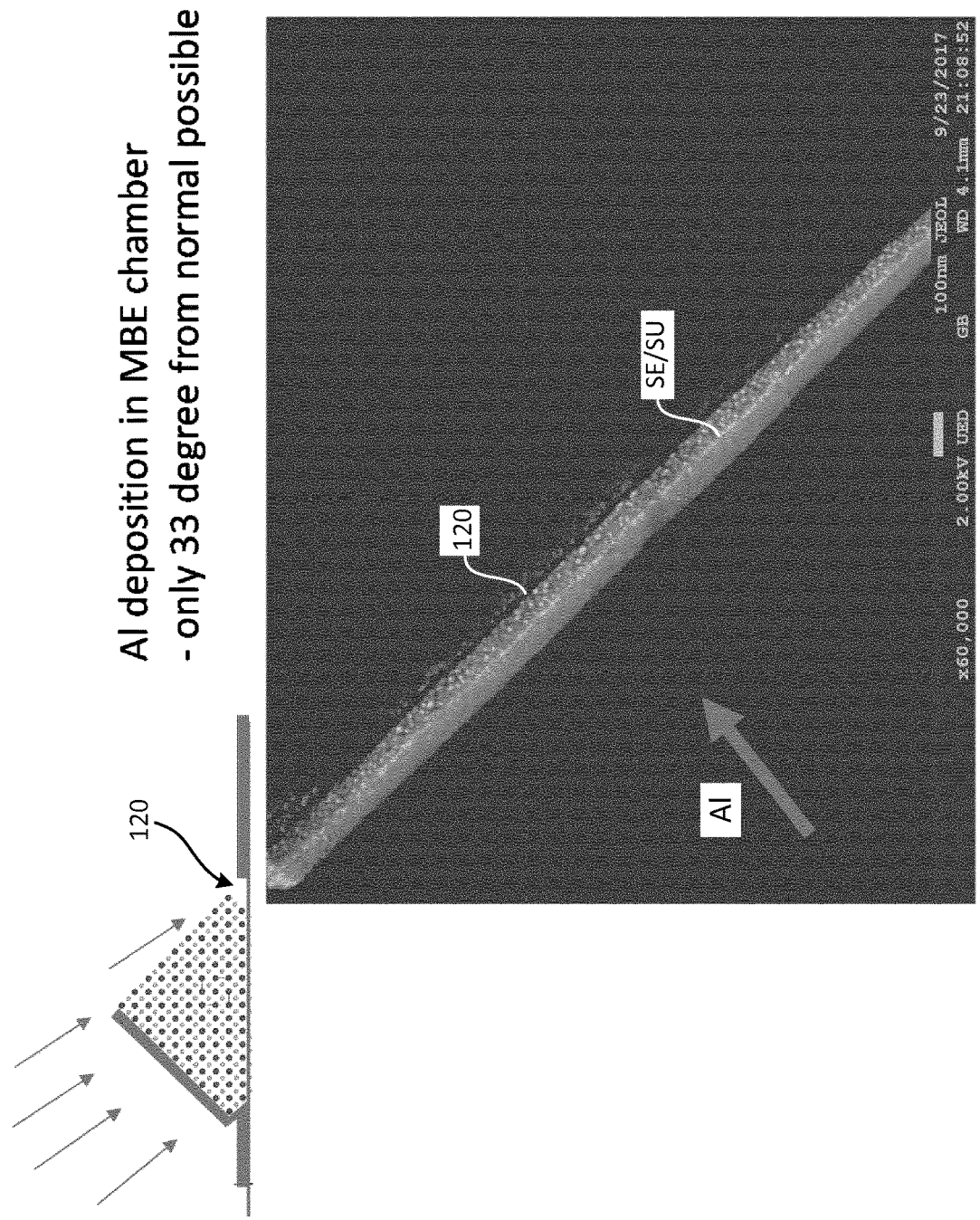
FIG. 13 shows an example of a [100] nanowire coated at a second deposition angle.
Figure 14:
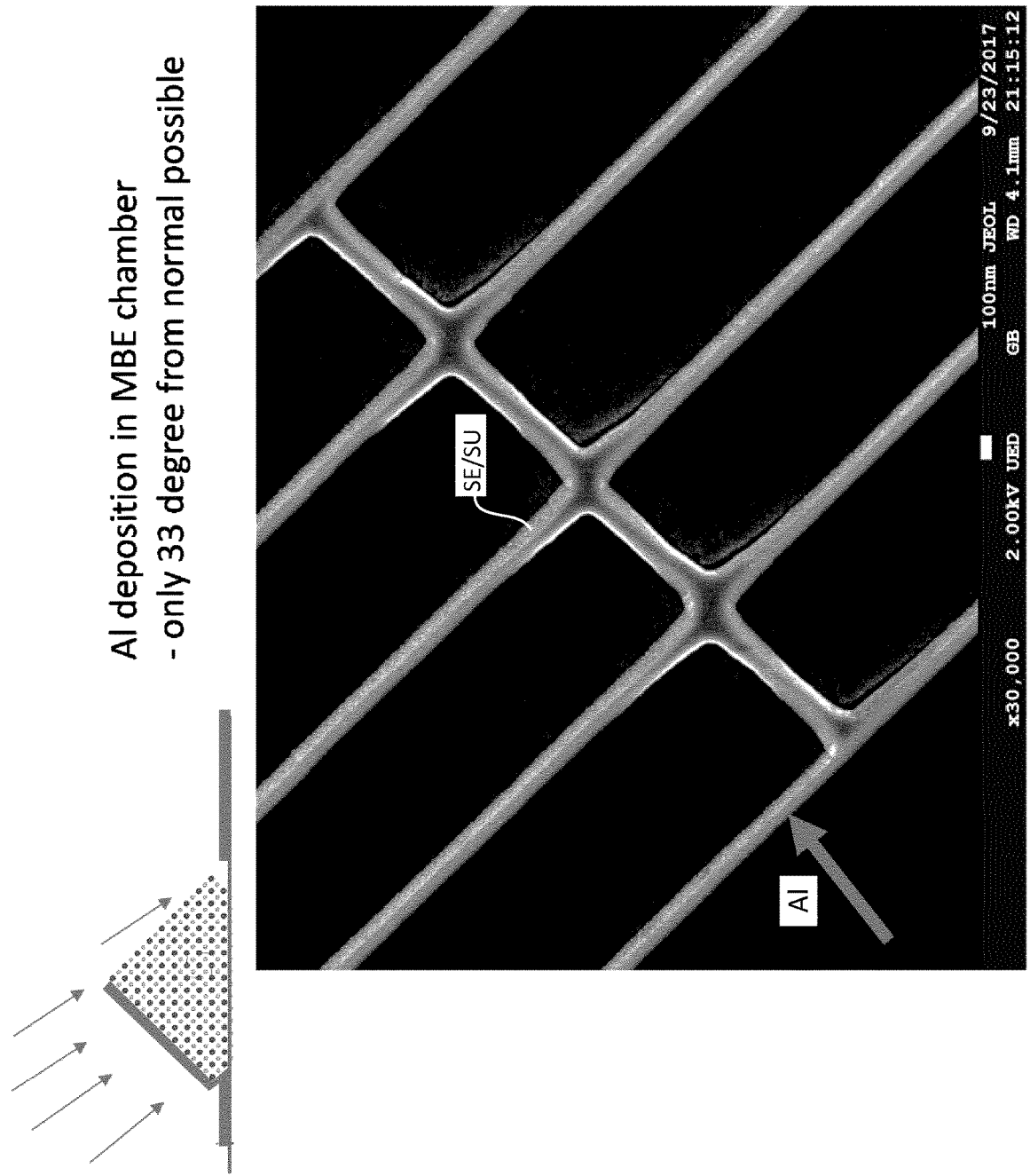
FIG. 14 shows a further image of [100] nanowires coated at the second disposition angle.

FIG. 12 and FIGS. 13-14 show top-down images of fabricated SE//SU nanowires for different deposition angles—illustrated schematically at the top-left of each figure. As can be seen, different deposition angles can be used to achieve shadow gaps 120 of different widths. Here, the shadow gap is created due to the SE nanowire 108 obstructing the angles beam, as described above, to separate the resulting SE/SU nanowire from a gating region 122.

The SE/SU nanowires of FIG. 12 were fabricated using Al deposition from an electron-gun (e-gun) at a low temperature stage in a metal deposition chamber.

The SE/SU nanowires of FIGS. 13 and 14 were fabricated using MBE, in an MBE chamber, with a beam angle of only 33 degrees from normal (i.e. relative to the z-axis as defined above). This is purely an example and most systems allow the angle to be varied to the desired direction.

Figure 15:
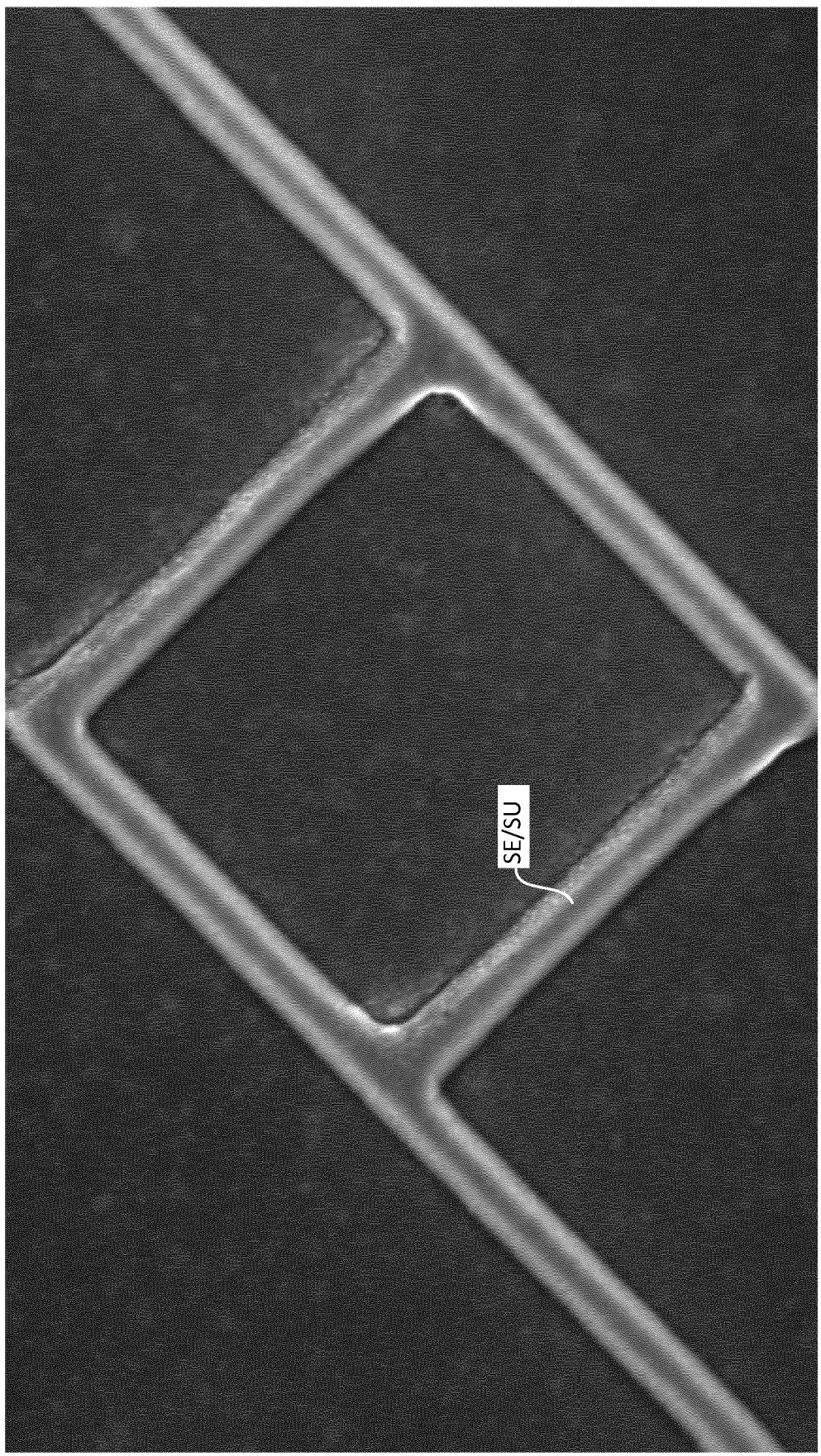
FIG. 15 shows a top view image of part of a SAG SE/SU nanowire network.

FIG. 15 shows another image of an SE/SU nanowire structure fabricated using the described methods.

In general, the superconducting material can either deposited/grown uniformly on the whole substrate and subsequently removed in specified regions, or deposited/grown in specified regions using lithography masks during deposition/growth. This can be a form on in-situ patterning, as described above. In some example implementations, the selective-area-grown materials leave conducting in-plane oriented nanowires that can be tuned with a side gate, top gate, and/or a bottom gate. Further, in some example implementations, the substrate is insulated to prevent leakage currents.

The disclosed methods, apparatus, and systems should not be construed as limiting in any way. The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of fabricating a mixed semiconductor-superconductor platform, the method comprising:
   in a masking phase, forming a dielectric mask on a substrate, such that the dielectric mask leaves two or more strips of the substrate exposed;
   in a selective area growth phase, selectively growing a semiconductor material on the substrate in the two or more exposed strips of the substrate to form a network of in-plane nanowires; and
   in a superconductor growth phase, forming a layer of superconducting material, at least part of which is in direct contact with the selectively grown semiconductor material in the two or more exposed strips of the substrate;
   wherein the mixed semiconductor-superconductor platform comprises the selectively grown semiconductor material and the superconducting material in direct contact with the selectively grown semiconductor material.

2. The method of claim 1, wherein the layer of superconducting material is epitaxially grown in the superconductor growth phase.

3. The method of claim 2, wherein the superconducting material is epitaxially grown using molecular beam epitaxy (MBE).

4. The method of claim 3, wherein the layer of superconducting material is formed, in the superconductor growth phase, using a beam.

5. The method of claim 4, wherein the beam has a non-zero angle of incidence relative to the normal of a plane of the substrate.

6. The method of claim 1, wherein the selective area growth phase and the superconductor growth phase are performed in a vacuum chamber, with the substrate remaining in the vacuum chamber and vacuum maintained throughout and in between those phases.

7. A method of fabricating a mixed semiconductor-superconductor platform, the method comprising:
   in a masking phase, forming a dielectric mask on a substrate, such that the dielectric mask leaves one or more regions of the substrate exposed;
   in a selective area growth phase, selectively growing a semiconductor material on the substrate in the one or more exposed regions; and
   in a superconductor growth phase, forming a layer of superconducting material, at least part of which is in direct contact with the selectively grown semiconductor material;
   wherein the mixed semiconductor-superconductor platform comprises the selectively grown semiconductor material and the superconducting material in direct contact with the selectively grown semiconductor material, and
   wherein the layer of superconducting material is epitaxially grown in the superconductor growth phase using molecular beam epitaxy (MBE) with a beam having a non-zero angle of incidence relative to the normal of a plane of the substrate such that the beam is angled relative to the substrate, such that the beam is incident on one side of a structure protruding outwardly of the plane of the substrate, thereby preventing a shadow region on the other side of the protruding structure from being covered with the superconductor material.

8. The method of claim 7, wherein the protruding structure is a protruding portion of the semiconductor material, such that the shadow region separates the semiconductor material from a portion of the superconductor material deposited in a gating region.

9. The method of claim 8, comprising:
   removing semiconductor material from the gating region; and
   forming a gate, from a gating material, in the gating region.

10. The method of claim 7, wherein the protruding structure is formed of dielectric material.

11. The method of claim 7, wherein the protruding structure is adjacent a nanowire formed by the semiconductor material, the shadow region extending across a width of the nanowire such that a section of the nanowire is not covered by the superconductor material across its entire width, thereby forming a junction between two further sections of the nanowire, both of which are at least partially covered by the superconductor material.

12. The method of claim 7, wherein the selective area growth phase and the superconductor growth phase are performed in a vacuum chamber, with the substrate remaining in the vacuum chamber and vacuum maintained throughout and in between those phases.

* * * * *